United States Patent
Tsironis

(10) Patent No.: US 8,461,946 B1
(45) Date of Patent: Jun. 11, 2013

(54) IMPEDANCE TUNERS WITH MECHANICAL STOP

(76) Inventor: Christos Tsironis, Kirkland (CA)

( * ) Notice: Subject to any disclaimer, the term of this patent is extended or adjusted under 35 U.S.C. 154(b) by 16 days.

(21) Appl. No.: 12/805,897

(22) Filed: Aug. 24, 2010

Related U.S. Application Data

(60) Provisional application No. 61/282,976, filed on May 3, 2010.

(51) Int. Cl.
*H03H 7/38* (2006.01)
(52) U.S. Cl.
USPC .......................................... 333/263; 333/17.3
(58) Field of Classification Search
USPC ................ 333/17.3, 32, 33, 263; 324/76.49, 324/76.51, 76.11, 642, 637
See application file for complete search history.

(56) References Cited

U.S. PATENT DOCUMENTS

| | | | |
|---|---|---|---|
| 5,982,251 A * | 11/1999 | Weinschel et al. | ............... 333/33 |
| 6,674,293 B1 | 1/2004 | Tsironis | |
| 7,280,012 B2 | 10/2007 | Boulerne | |
| 7,589,601 B2 | 9/2009 | Simpson | |

* cited by examiner

*Primary Examiner* — Stephen Jones

(57) ABSTRACT

Wideband and multi-section probes (slugs) for slide-screw impedance tuners use means for mechanical limitation of vertical movement towards the center conductor of the slablines, in form of cross bar structures and/or adjustable screws or dowel pins, in order to prevent the probes from having mechanical/galvanic contact with the center conductor of the slabline. The limiting screws or dowel pins can be mounted on the probes themselves or on the vertical tuner axis. Fine adjustment allows optimizing the maximum reflection factor at various frequency ranges and probe sizes.

23 Claims, 22 Drawing Sheets

Using vertical screws on the probe to prevent mechanical contact between probe and center conductor

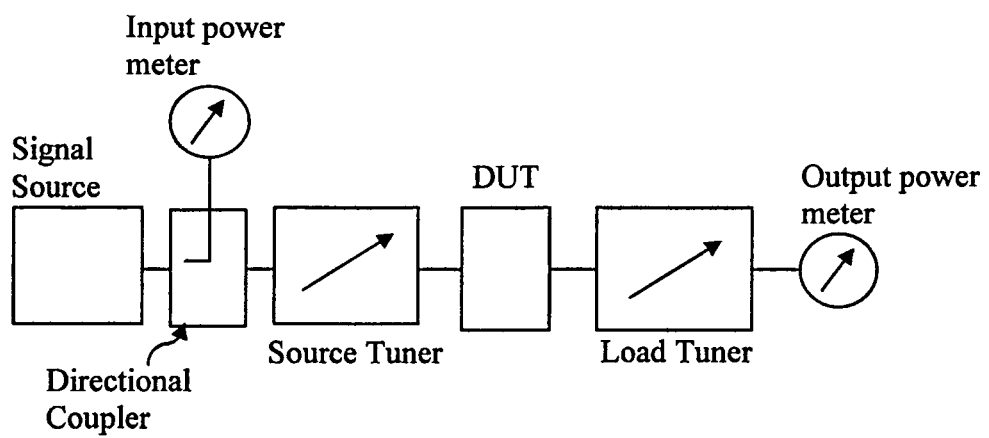
FIGURE 1: Prior art, Load Pull measurement setup

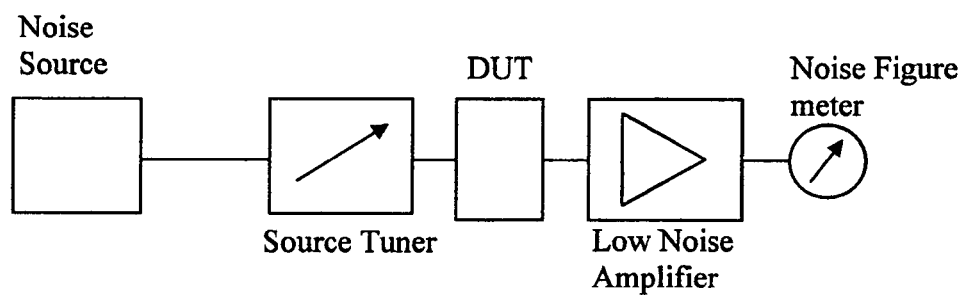
FIGURE 2: Prior art, Noise measurement setup

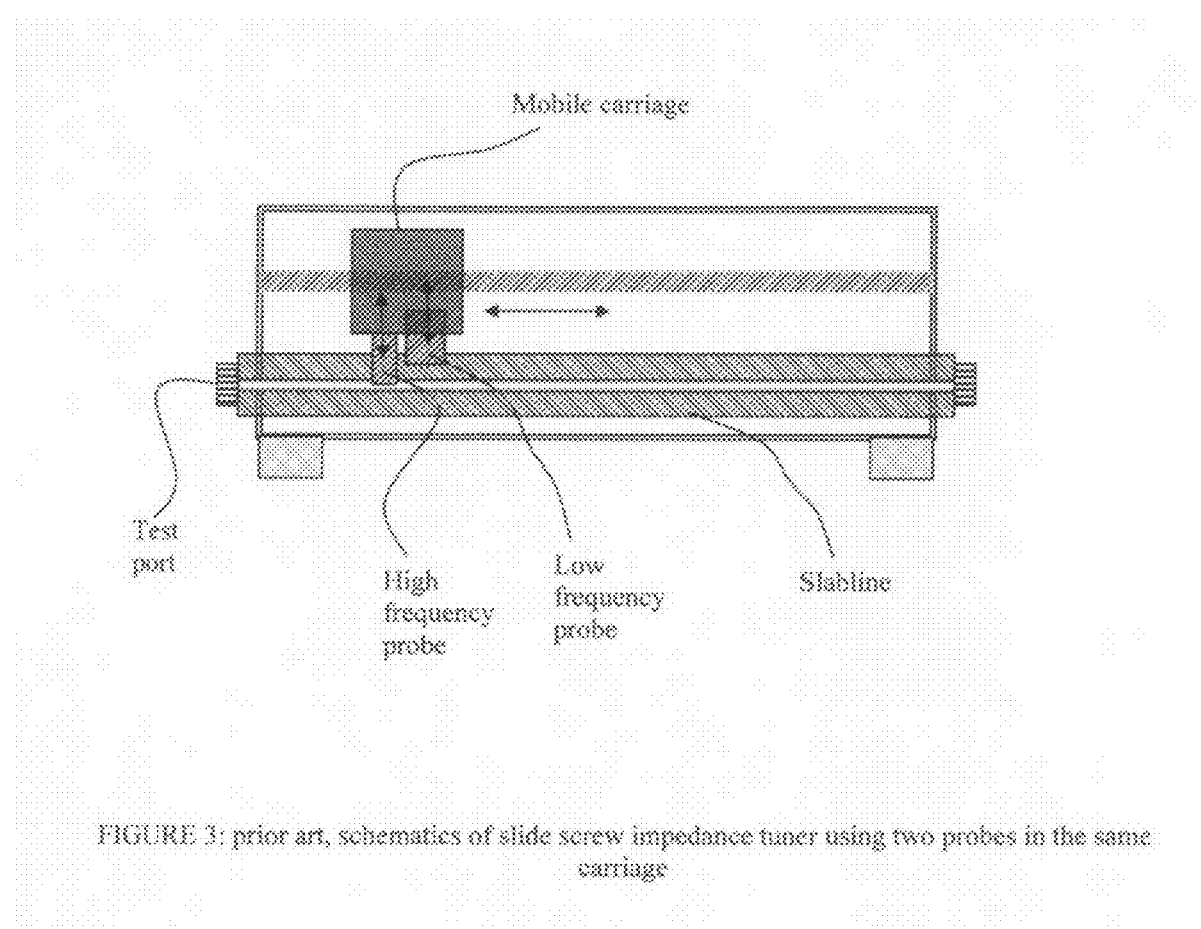
FIGURE 3: prior art, schematics of slide screw impedance tuner using two probes in the same carriage

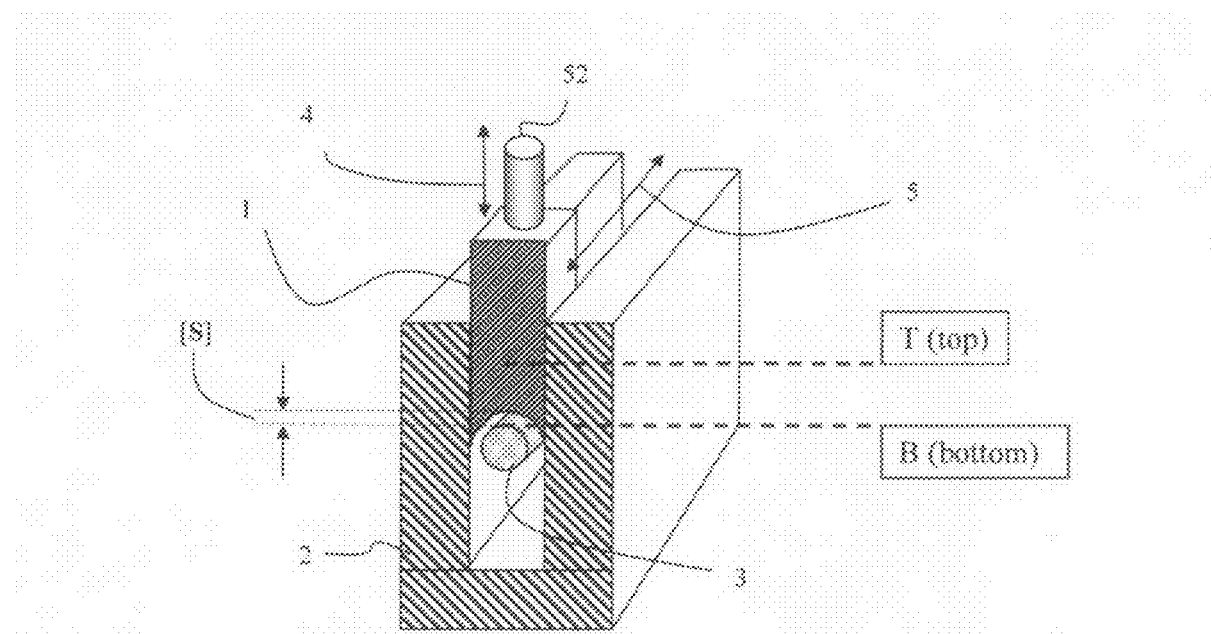
FIGURE 4: Prior art, cross section of RF probe in a slabline of a slide screw impedance tuner

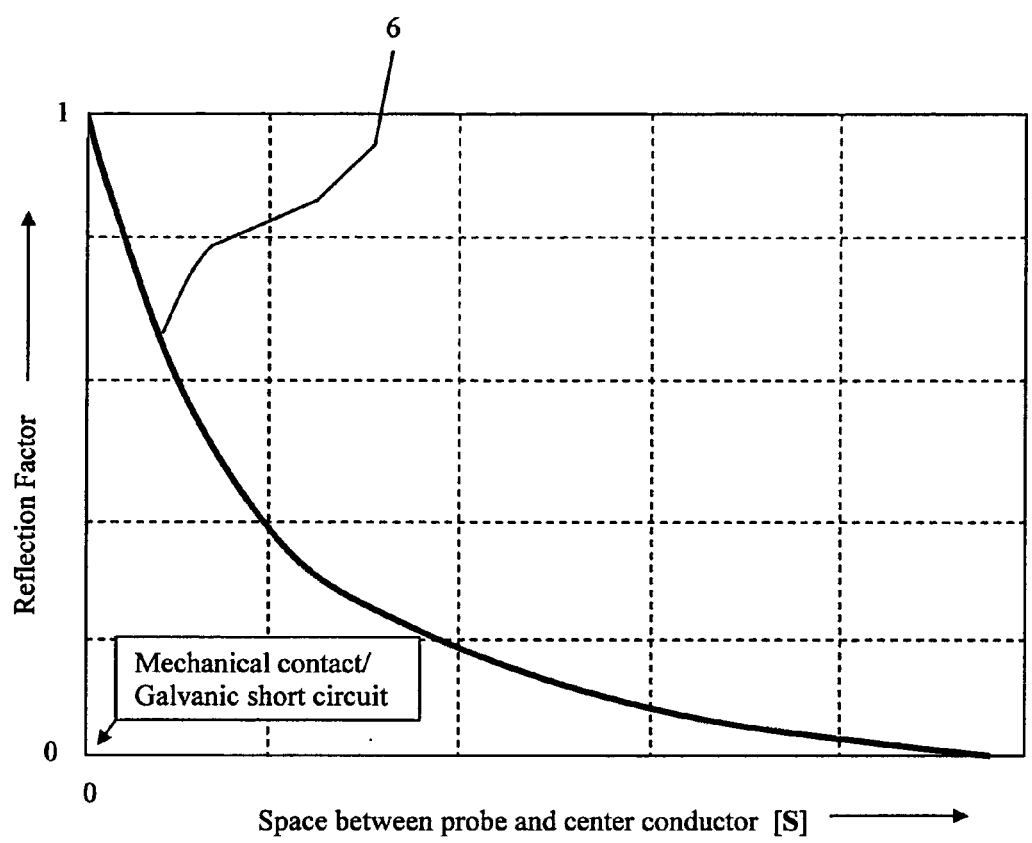
FIGURE 5: Prior art, dependence of reflection factor from distance 'probe-center conductor'

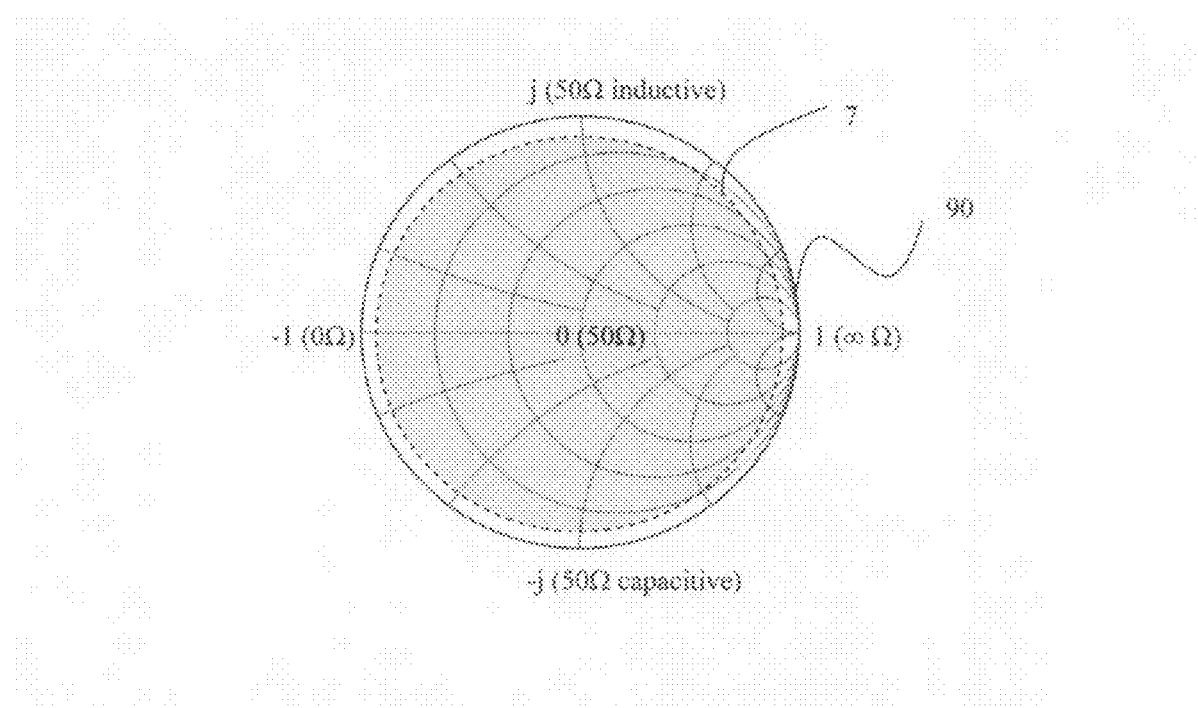
FIGURE 6: Prior art, Smith chart showing the maximum reflection factor of a slide screw tuner

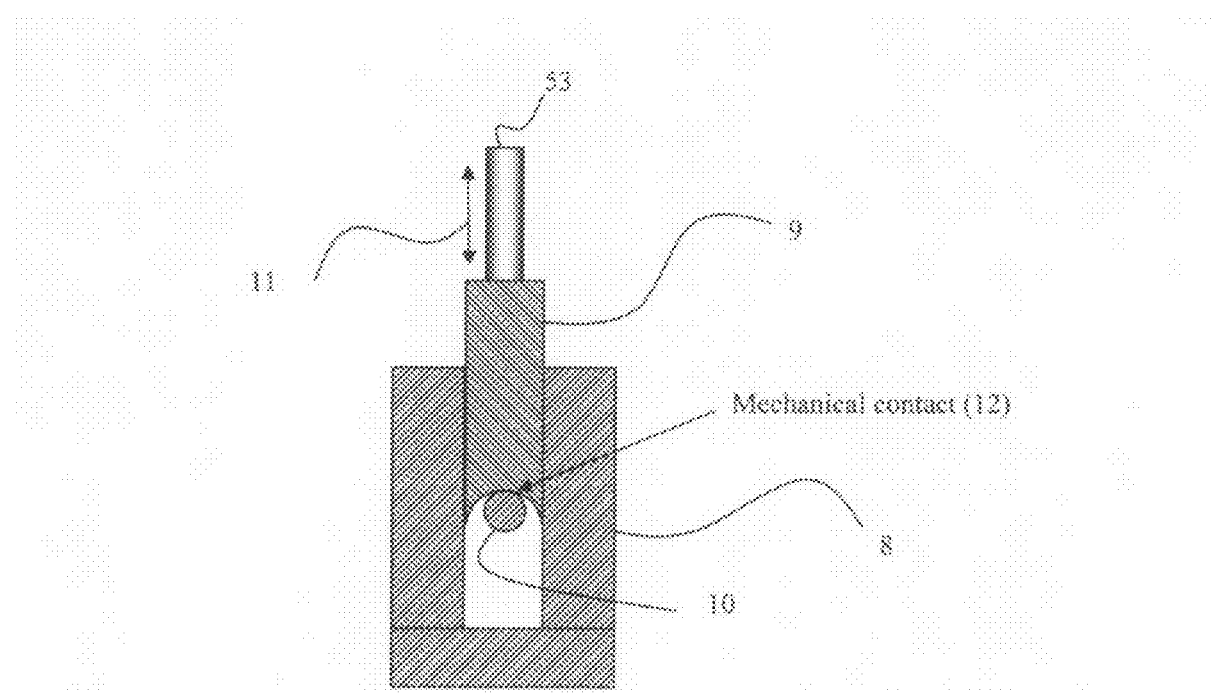
FIGURE 7: Prior art, cross section of RF probe making mechanical (galvanic) contact with the center conductor

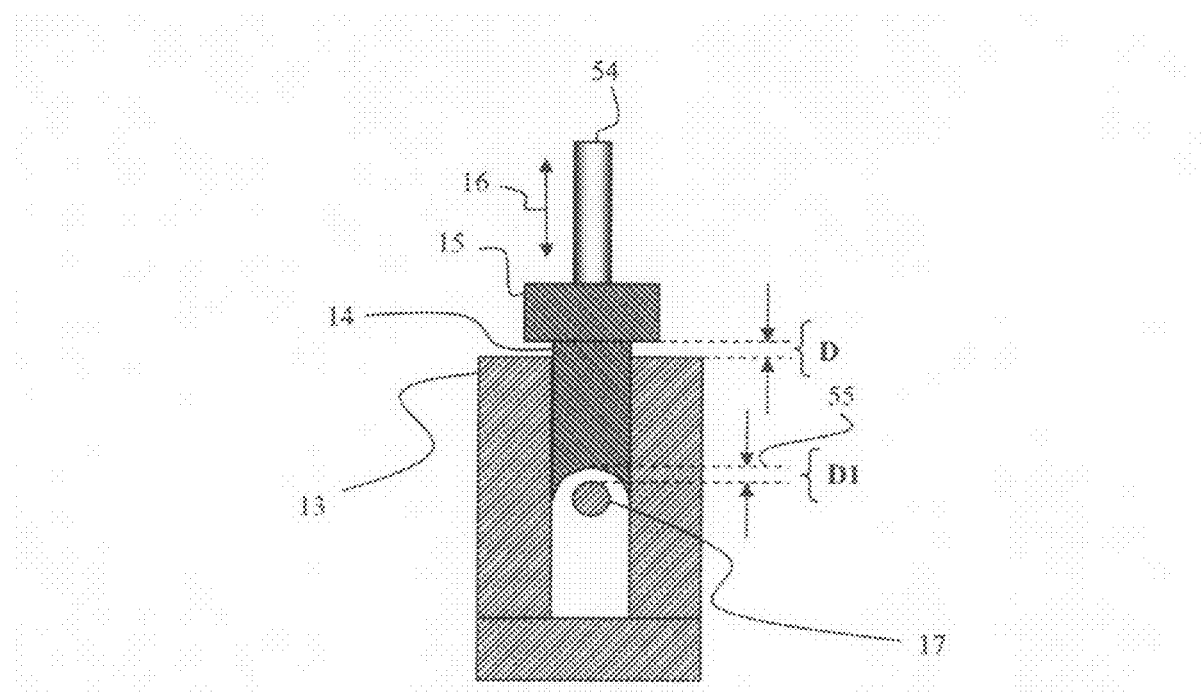
FIGURE 8: Protecting the probe from moving closer to center conductor using T-type stops on the probes

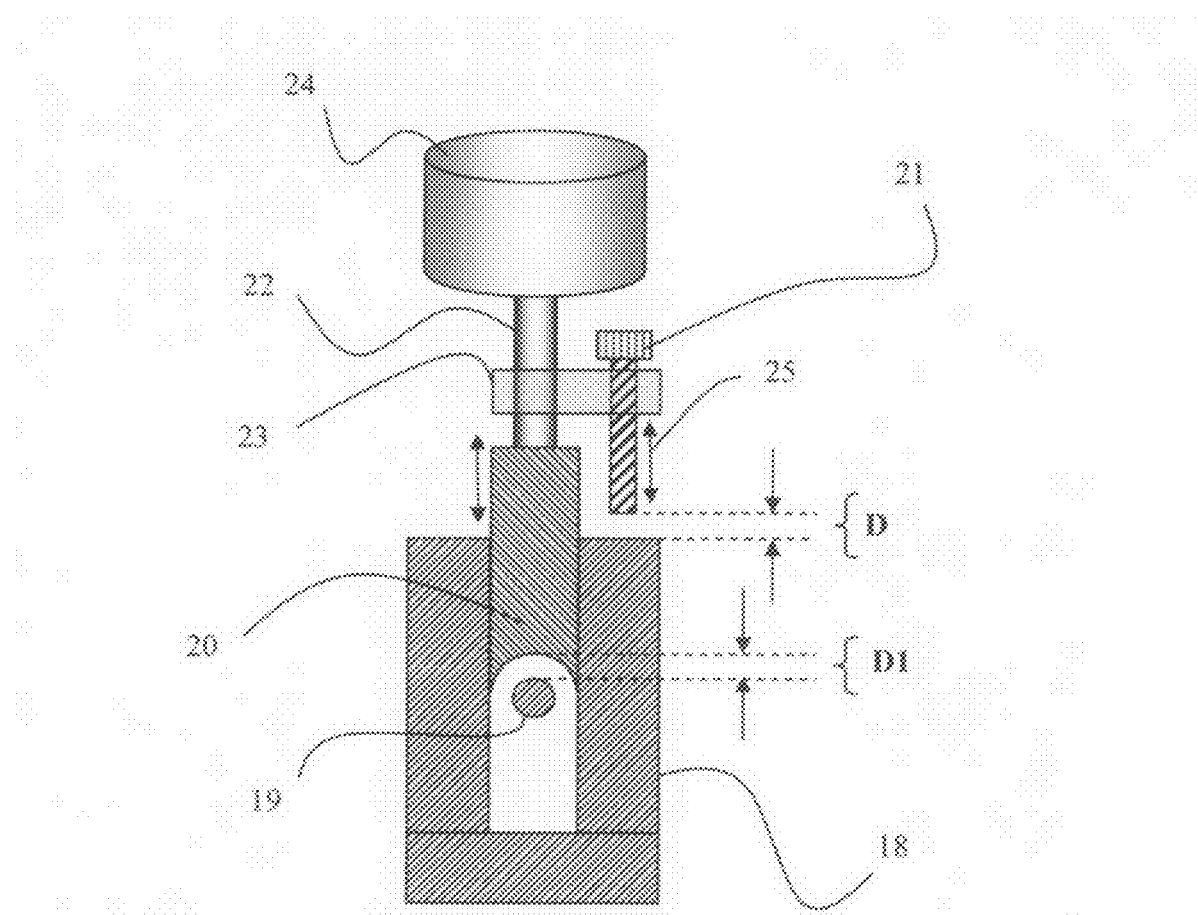
FIGURE 9: Using vertical screw on the axis to stop the probe from touching the center conductor

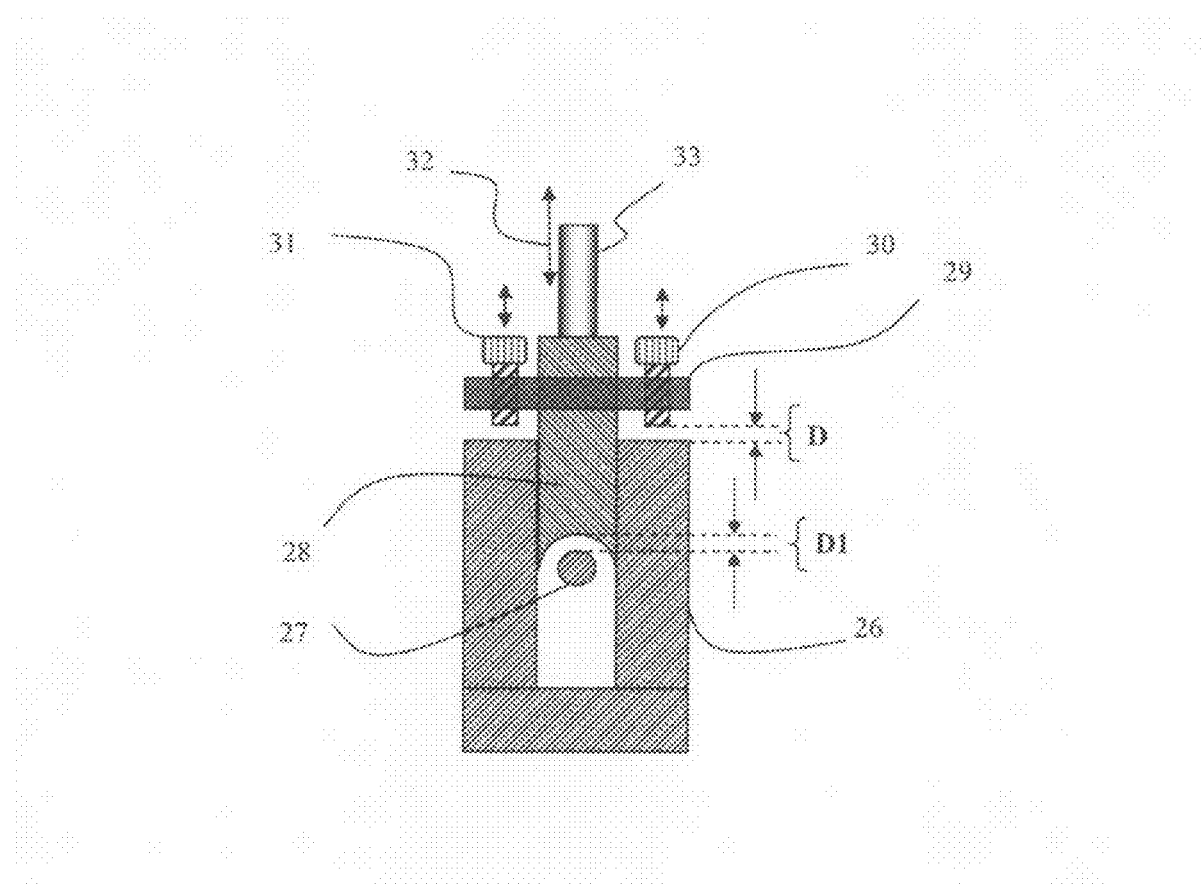
FIGURE 10: Using vertical screws on the probe to prevent mechanical contact between probe and center conductor

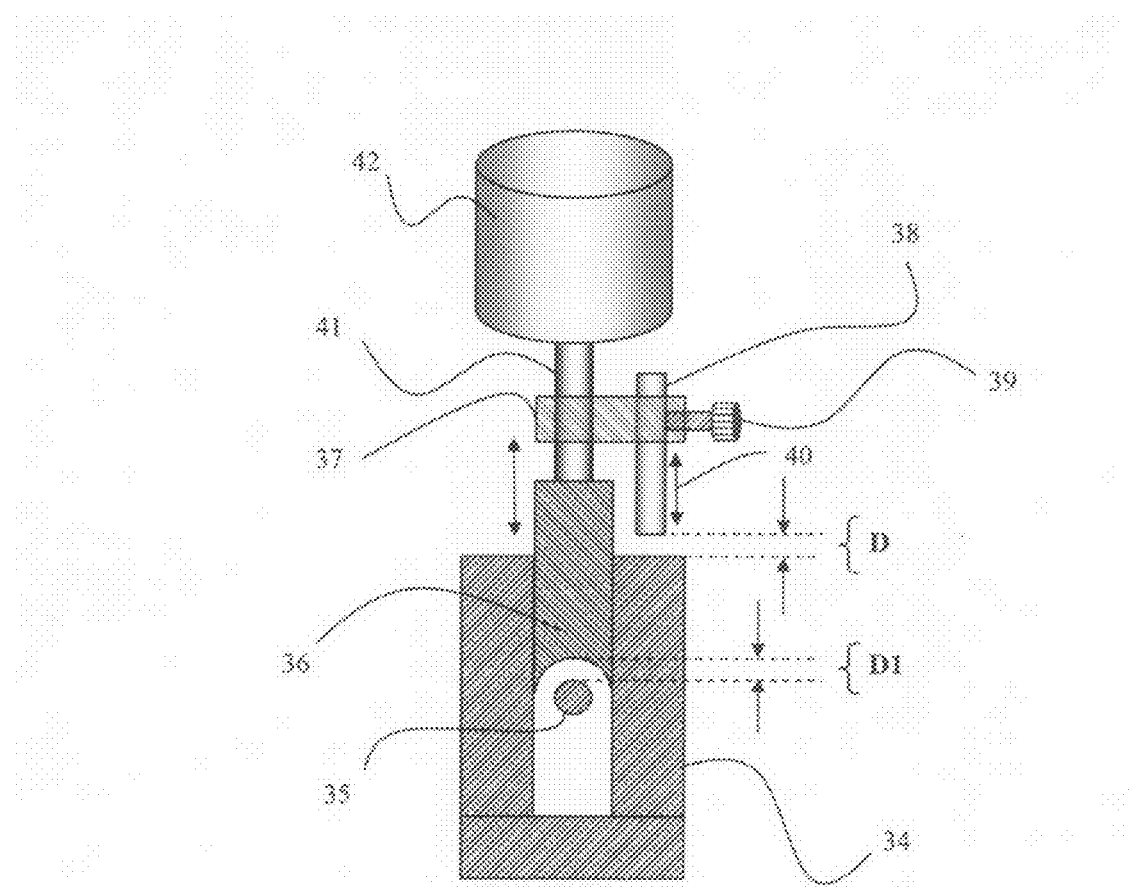
FIGURE 11: Using adjustable dowel pin on the axis to prevent mechanical contact between probe and center conductor

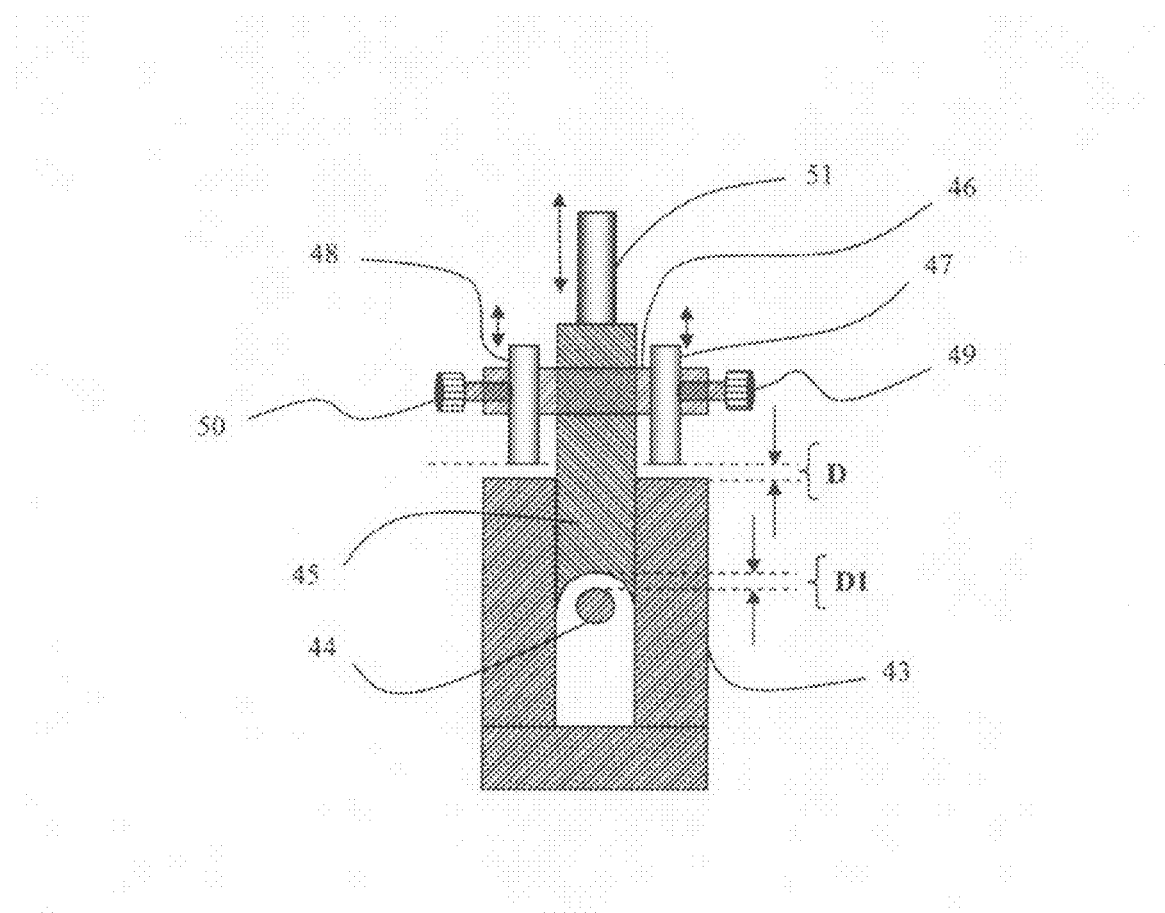
FIGURE 12: Using adjustable dowel pins to prevent mechanical contact between probe and center conductor

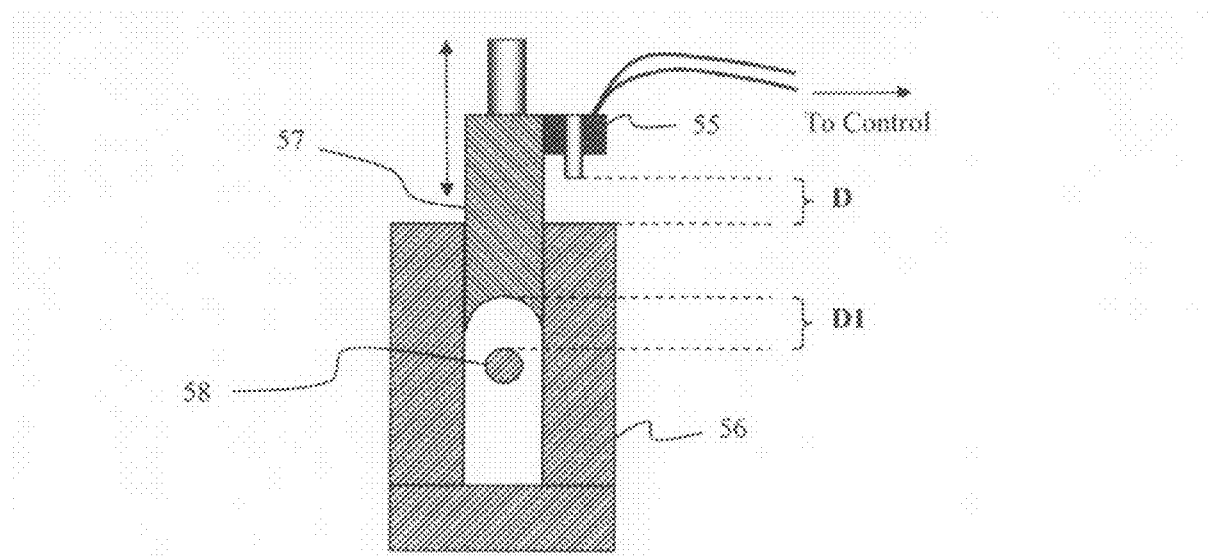
FIGURE 13: Prior art, proximity switch preventing mechanical contact between probe and center conductor
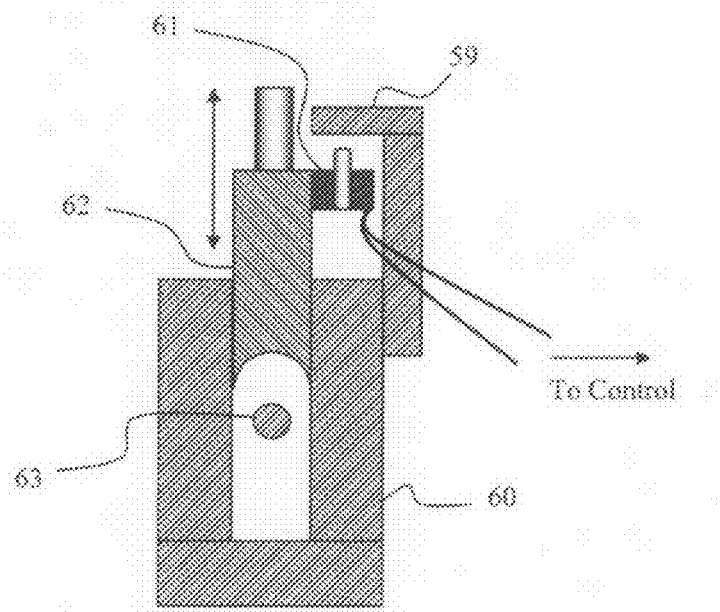
FIGURE 14: Prior art, zeroing (initialization) switch

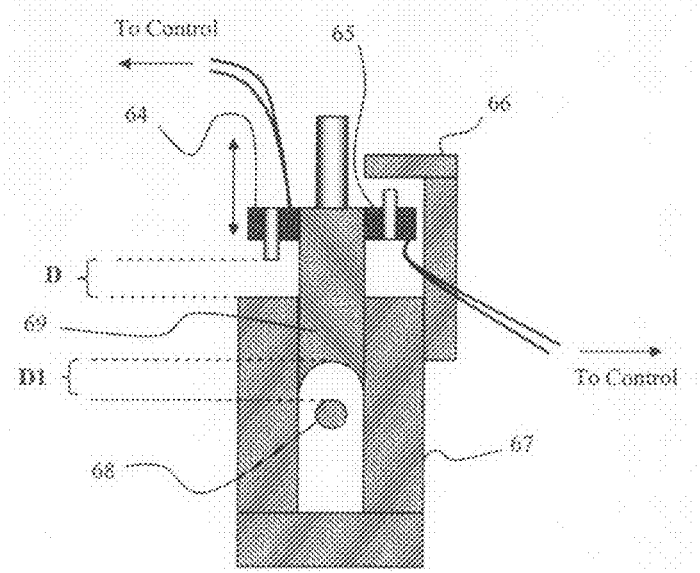
FIGURE 13: Prior art, combination of initialization and proximity limit switch

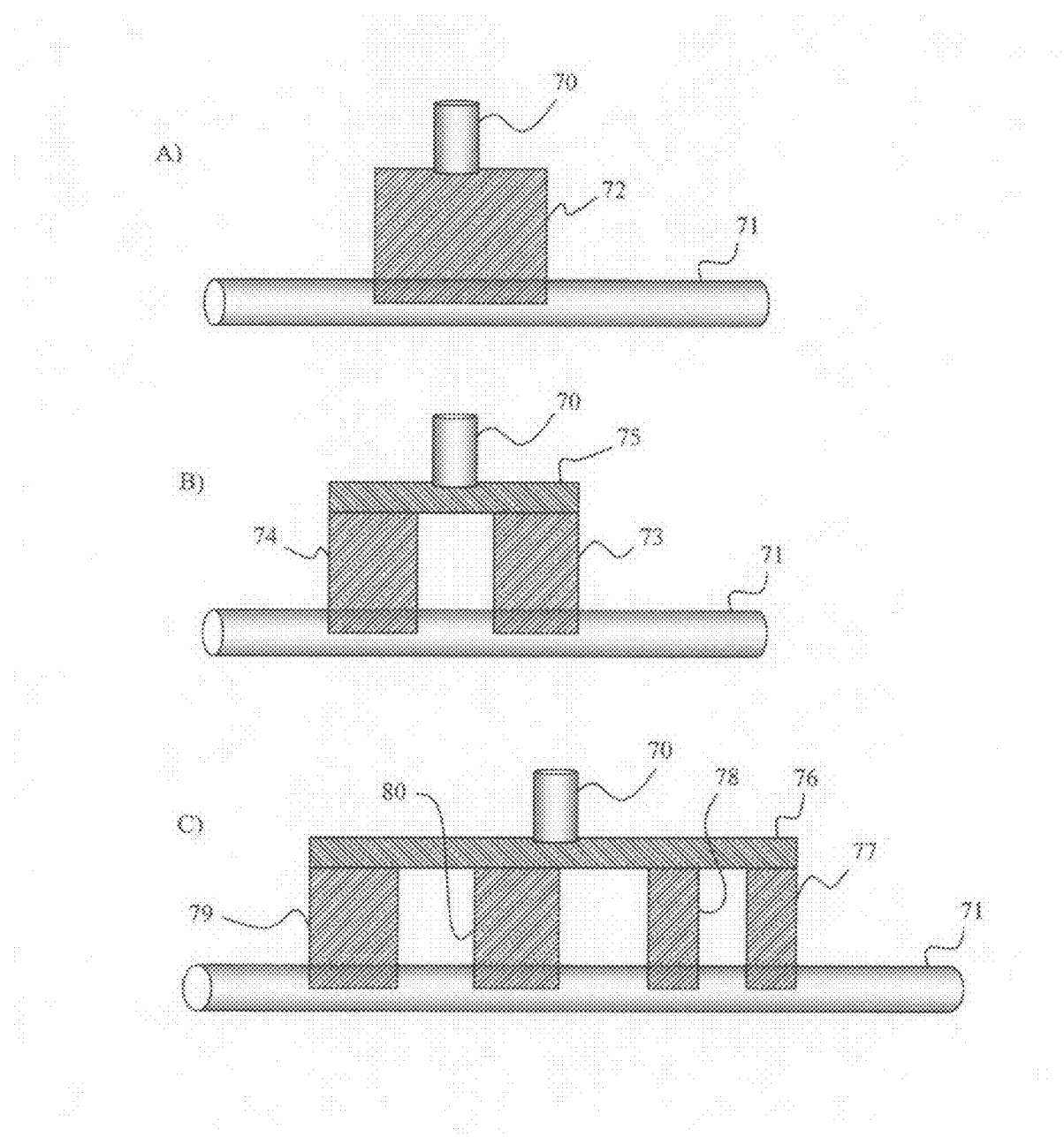
FIGURE 16A-C: Prior art, RF tuner probes with single and multiple conductive sections

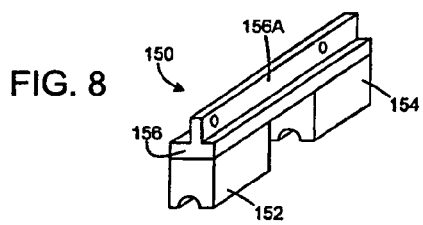
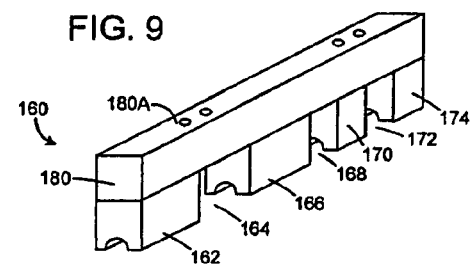
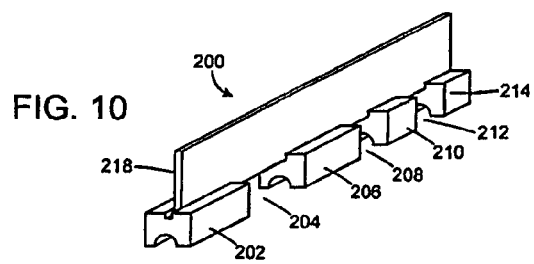
FIGURE 17, Prior art, multiple section probes on which mechanical stops are applicable

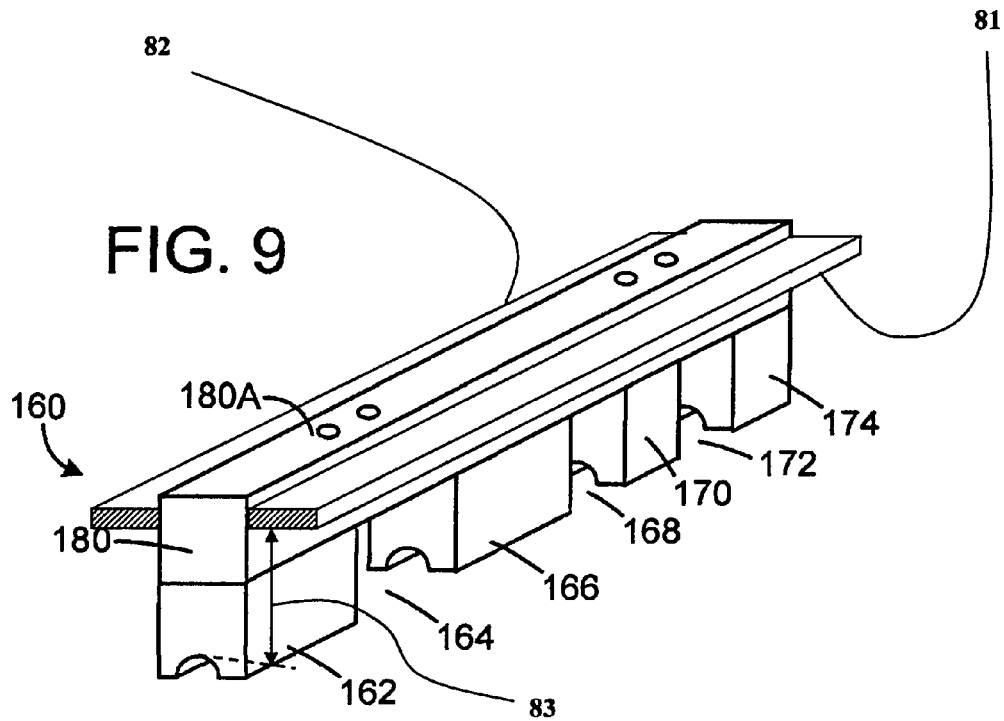
FIGURE 18: Example of implementation of mechanical means of contact prevention on prior art multi-section probes

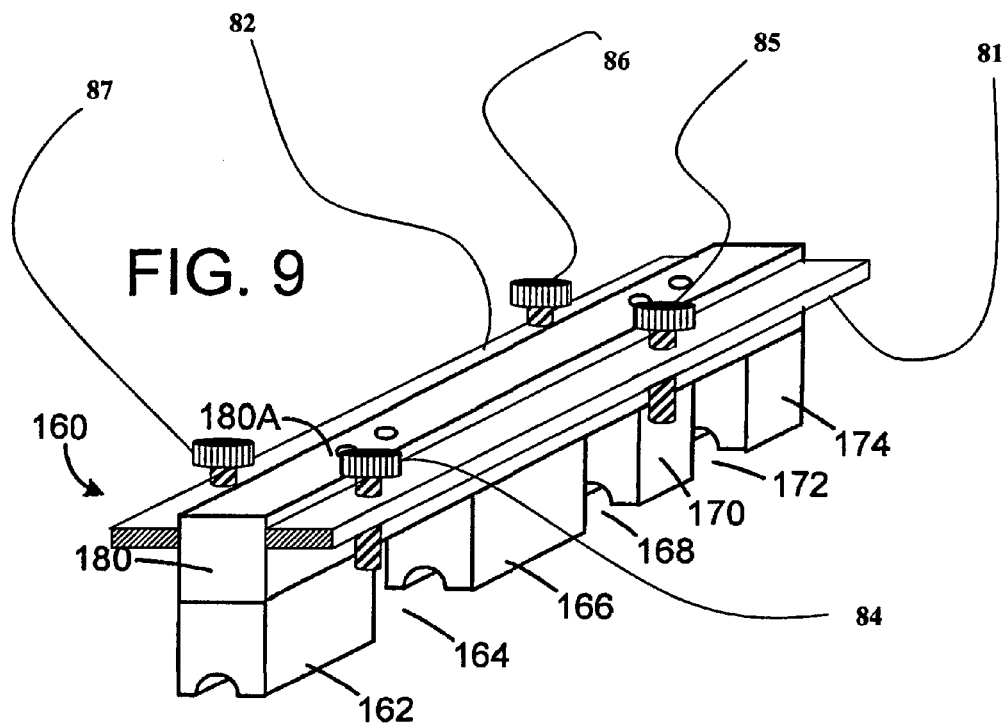
FIGURE 19: Implementation of adjustable mechanical means of contact prevention on prior art multi-section probes

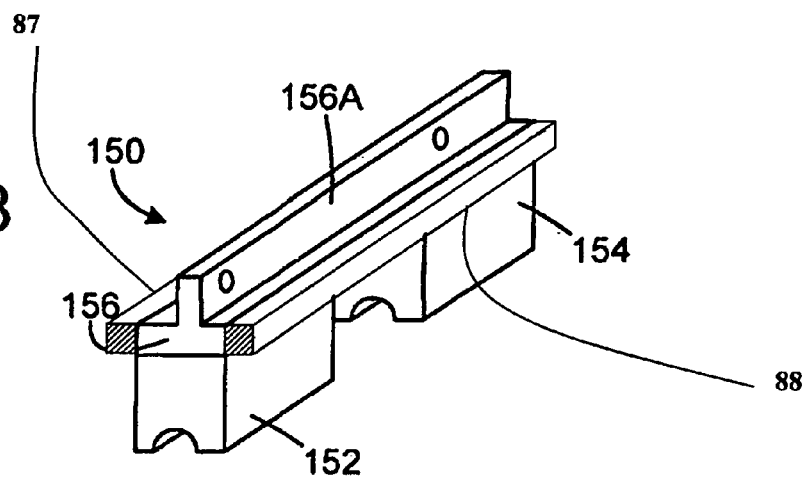
FIGURE 20: Implementation of permanent mechanical means of contact prevention on prior art multi-section probes

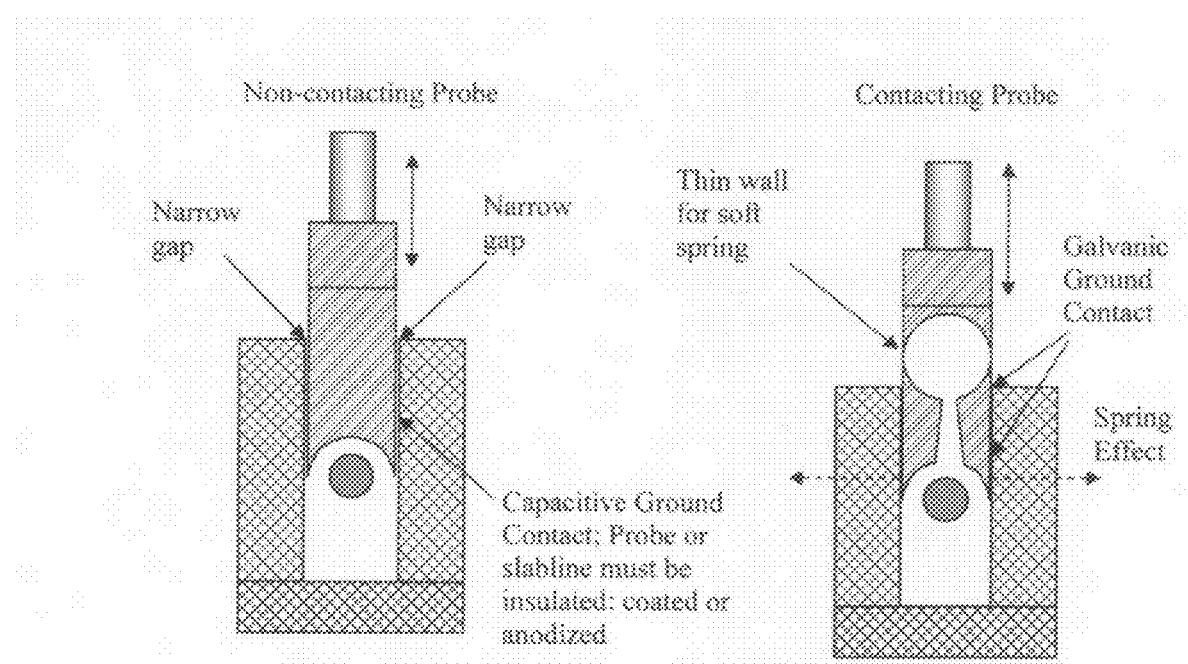
FIGURE 21: Prior art, cross sections and comparison between contacting and non-contacting tuner probes

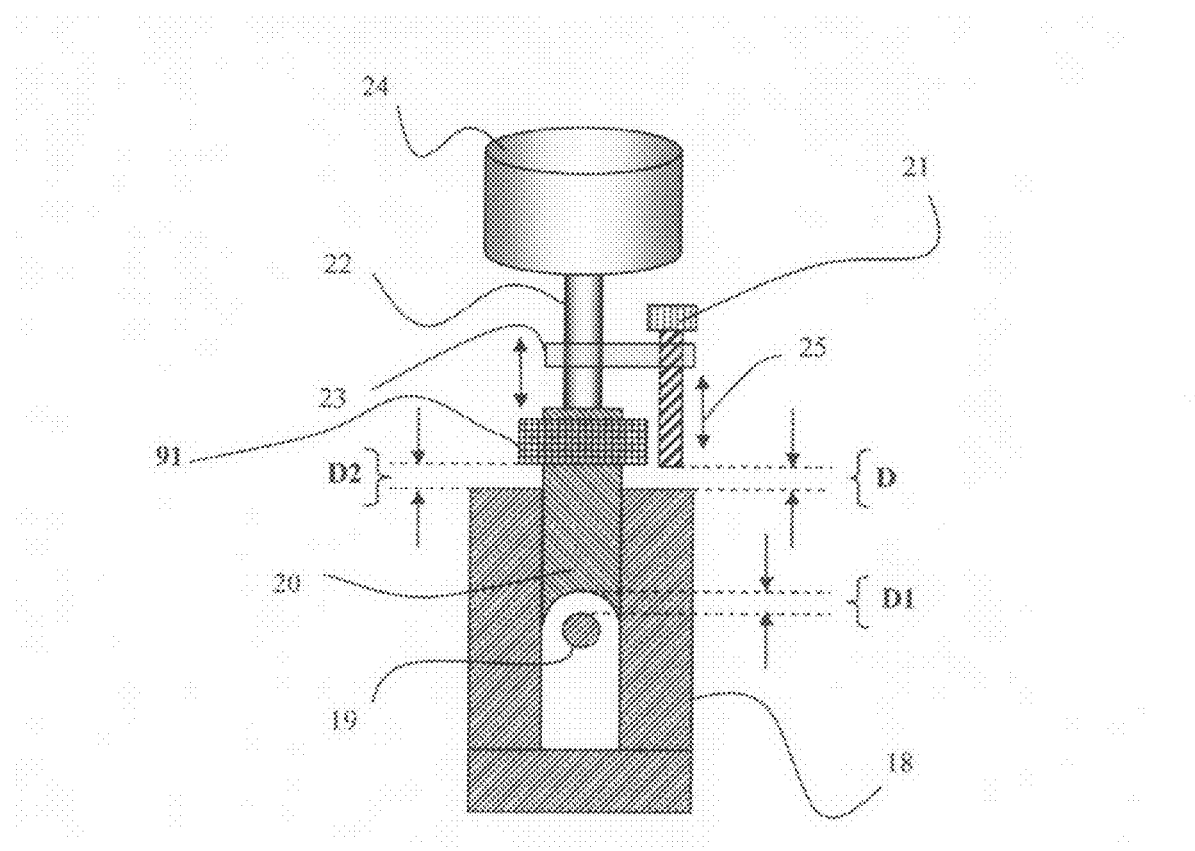
FIGURE 22: Combination of permanent and adjustable obstacles of vertical probe movement.

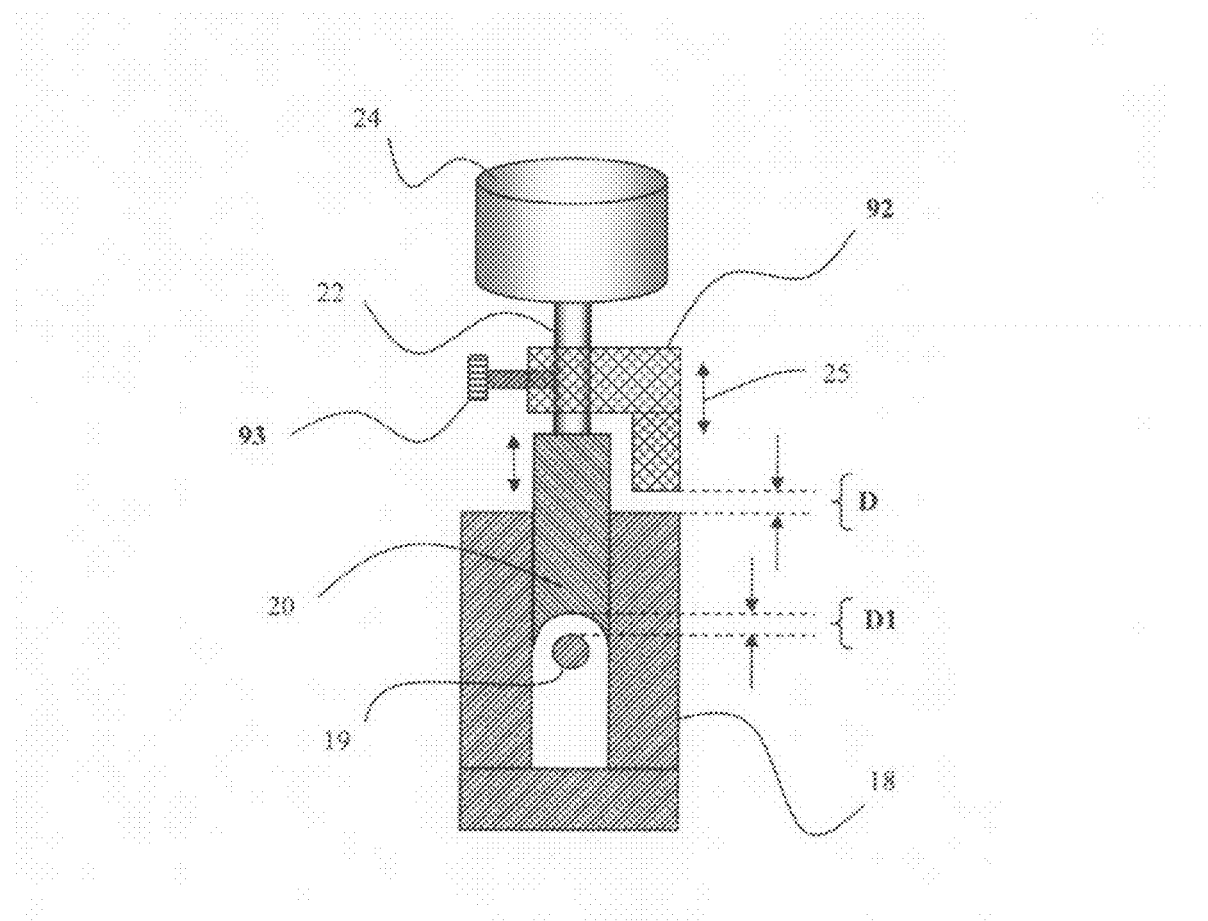
FIGURE 23: Adjustable mechanical obstacle of vertical probe movement mounted on vertical axis.

IMPEDANCE TUNERS WITH MECHANICAL STOP

PRIORITY CLAIM

This application claims the benefit of U.S. Provisional Application No. 61/282,976 filed on May 3, 2010, hereby incorporated by reference.

CROSS-REFERENCE TO RELATED ARTICLES

[1] Computer Controlled Microwave Tuner—CCMT; Product Note 41, Focus Microwaves.
[2] http://www.microwaves101.com/encyclopedia/loadpull.cfm#definitions
[3] On-Wafer Noise Parameter Measurements using Cold-Noise Source and Automatic Receiver Calibration; Application Note 19, Focus Microwaves, January 1999.
[4] Tsironis, U.S. Pat. No. 6,674,293, Adaptable pre-matched tuner system and method.
[5] Simpson, U.S. Pat. No. 7,589,601 B2, Impedance Tuner Systems and Probes.
[6] Boulerne, U.S. Pat. No. 7,280,012 B2, Multi-probes as single RF tuning element for slide screw tuners.
[7] Why are Maury tuners better?: http://www.maurymw.com/dc_ent.htm

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to automatic impedance tuners used in load pull testing of power transistors and noise testing of low noise transistors; said tuners allow synthesizing appropriate RF reflection factors (or complex impedances) at the input and output of said transistors [1].

A popular method for testing and characterizing RF components (transistors) for high power or low noise operation is "load pull" and "source pull". Load pull or source pull are automated measurement techniques used to measure Gain, Power, Efficiency and other characteristics of the DUT, employing source and load impedance tuners and other test equipment, such as signal sources, directional couplers, test fixtures to house the DUT (device under test, typically an RF transistor) and input and output power meters (FIG. 1) [2]. To measure noise figure and noise parameters of a low noise device a similar setup is used (FIG. 2), in which the signal source is replaced by a calibrated standard noise source and the power meter by a sensitive noise figure analyzer, following a signal amplifying, low-noise amplifier [3]. The tuners in particular are used in both setups, in order to manipulate the RF impedance conditions under which the DUT is tested.

A popular family of electro-mechanical (automated) tuners are the "slide-screw tuners" shown schematically in FIG. 3. Slide screw tuners comprise a slotted low loss airline (slabline) with a test port adjacent to the DUT, one or more remotely controlled mobile carriages, which can travel parallel to the axis of said slabline, and carry one or more RF probes each [4]. FIG. 4 shows schematically a perspective cross section of a slabline (2) and a tuner probe. Said probes (1) are insertable (4) into and can slide inside the slot of the slabline. The probes can also move horizontally (5) parallel to the center conductor (3). Typically all probes (1, 9, 14, 20, 28, 36, 45) disclosed in this invention and shown in FIGS. 4, 7, 8, 9, 10, 11, 12, correspondingly, are made of conductive material and are attached to vertical axes (52, 53, 54, 22, 33, 41, 51) [4, 5, 6]. Said vertical axes are driven by stepper motors and allow very accurate positioning control of the distance between the probes and the center conductor of the slablines [S] in FIG. 4. Wide probes are used for low frequencies, narrow probes for high frequencies. The probes have a concave bottom so that they create high capacitive coupling with the center conductor and insert a conductive body between the center conductor and the sidewall of the slabline, where most of the electric field is concentrated.

DESCRIPTION OF PRIOR ART

Each mobile carriage of said tuner comprises one or two vertical axes, which are driven by appropriate gear mechanism manually or by remotely controlled electrical motor. Each vertical axis holds one conductive RF probe (1), FIG. 4, which is dimensioned such as to slide inside the slot of said airline (or slabline (2) and be positioned at various distances from the center conductor (3) of said slabline [4, 5, 6]. The RF probes (1) have a concave channel at their bottom close to the center conductor (3) and are dimensioned such as to slide-fit over said center conductor. Said probes have a length, parallel to the axis of said airline, which depends on the frequency of operation of said impedance tuner: short RF probes cover higher frequencies whereas long RF probes operate better at low frequencies. Coupling between the probes (1) and the center conductor (3) is capacitive and ground contact between said RF probes and the body of the airline (2) is either capacitive or galvanic (FIG. 21). Said capacitive contact is established by dielectric coating or anodizing the RF probes and/or anodizing the airline, depending on whether item is made of material that can be anodized, such as Aluminum. Moving the probe horizontally along the slabline (5) allows changing the phase of the reflection factor.

The probe (1), FIG. 4, of said slide screw tuner is attached to a vertical axis (52) and can be moved vertically (4) between a high position (Top) and a low position (Bottom). The high position is selected such that the probe does not interfere noticeably with the electric field between center conductor (3) and the lateral walls of the slabline (2), the low position being such that a required reflection factor of the signal flow is obtained ((6), FIG. 5) [4]. If the probe (1) makes galvanic contact with the center conductor (3), creating a short circuit', then the signal flow through the tuner stops, measurements are meaningless and, under circumstances, the DUT may be damaged, especially if there is a DC voltage applied at this point through the tuner center conductor (3). If the probe has a protective coating on the concave surface facing the center conductor (FIG. 4), then a mechanical contact between the probe and the center conductor does not necessarily mean also a galvanic contact and short circuit, but it is to be avoided nevertheless. Since the center conductor of the slabline has some elasticity, temporary mechanical contacts are not damaging the tuner or alter its performance, but should not be part of normal operation. If, by control failure, human error or intentionally, the motor controlling the position of the vertical axis, is directed to step beyond the closest distance allowed, a short circuit, or mechanical contact, between probe and center conductor will occur. In order to avoid this event a mechanical stop must be introduced. This can be done in a matter of different ways.

FIG. 5 shows the reflection factor created by tuner probe at the tuner test port (FIG. 3) as a function (6) of the gap between said probe and center conductor [S]. If [S] becomes zero then we have mechanical contact between probe and center conductor and if the probe does not have insulating protective coating at its lower surface then we have also galvanic contact (short circuit). At short circuit the tuner loss becomes infinite and there is no power transfer from the test port to the output port of the tuner. The tuning operation is meaningless. Normal tuning operation is between a reflection factor close to zero (maximum value of [S]) and maximum reflection factor (minimum value of [S]). Exact values of minimum [S] depend on maximum reflection factor requirements, but also from frequency and probe size. Typical operational values can reach reflection factors up to 0.95 at typical [S] of the order of 0.1 mm; these values are not exact, they depend on frequency, probe size and insulation coating of the probes and are difficult to estimate.

FIG. 6 shows the tuning range of said tuners on a Smith Chart (90). Maximum possible tuning range is 1 but capacitance values between probe and center conductor and insertion losses in the slabline between test port and probe location (FIG. 3) limit said tuning range to a maximum value, as shown by the shaded area (7) [4].

BRIEF DESCRIPTION OF THE DRAWINGS

The invention and its mode of operation will be better understood from the following detailed description when read with the appended drawings in which:

FIG. 1 depicts prior art, Load Pull measurement setup.

FIG. 2 depicts prior art, Noise measurement setup.

FIG. 3 depicts prior art, schematics of slide screw impedance tuner using two probes in the same carriage.

FIG. 4 depicts prior art, cross section of RF probe in a slabline of a slide screw impedance tuner.

FIG. 5 depicts prior art, dependence of reflection factor from distance 'probe-center conductor'.

FIG. 6 depicts prior art, Smith chart showing the maximum reflection factor of a slide screw tuner.

FIG. 7 depicts prior art, cross section of RF probe making mechanical (galvanic) contact with the center conductor.

FIG. 8 depicts protecting the probe from moving closer to center conductor using T-type stops on the probes.

FIG. 9 depicts using vertical screw on the axis to stop the probe from touching the center conductor.

FIG. 10 depicts using vertical screws on the probe to prevent mechanical contact between probe and center conductor.

FIG. 11 depicts using adjustable dowel pin on the axis to prevent mechanical contact between probe and center conductor.

FIG. 12 depicts using adjustable dowel pins to prevent mechanical contact between probe and center conductor.

FIG. 13 depicts prior art proximity switch preventing mechanical contact between probe and center conductor.

FIG. 14 depicts prior art zeroing (initialization) switch.

FIG. 15 depicts prior art combination of initialization and proximity limit switch.

FIG. 16 depicts prior art RF tuner probes with single and multiple conductive sections.

FIG. 17 depicts prior art multiple section probes on which mechanical stops are applicable.

FIG. 18 depicts example of implementation of mechanical means of contact prevention on prior art multi-section probes.

FIG. 19 depicts implementation of adjustable mechanical means of contact prevention on prior art multi-section probes.

FIG. 20 depicts implementation of permanent mechanical means of contact prevention on prior art multi-section probes.

FIG. 21 depicts prior art, cross sections and comparison between contacting and non-contacting tuner probes.

FIG. 22 depicts a combination of permanent and adjustable obstacles of vertical probe movement.

FIG. 23 depicts adjustable mechanical obstacle of vertical probe movement mounted on vertical axis.

DETAILED DESCRIPTION OF THE INVENTION

FIG. 7 shows the prior art situation, where said probe (9) is attached on a vertical axis (53) and is movable vertically (11) inside the slabline (8) but does not have any direct mechanical means for preventing mechanical contact (12) with the center conductor (10). Alternative methods for avoiding mechanical contact have been used and are all indirect (FIGS. 13, 14, 15); they introduce either an opto-electronic or electro-mechanical limit switch (55) such as to instruct the motor control to stop lowering the probe (57) when the probe reaches a pre-defined closest position to the center conductor (58), FIG. 13; in this case the distance D between the tip of said switch (55) and the top of said slabline (56) is chosen smaller than the distance D1 between the bottom of the probe (57) and the top of the center conductor (58). In FIG. 14 a switch (61) is used to "zero" the probe (62) at the highest position (59), count the motor steps until the bottom position is reached and instruct the software control to stop before the probe (62) touches the center conductor (63) [1, 4]. In FIG. 15 two switches (64, 65) are used to zero the probe (69) at the highest (66) and the lowest (67) position, choosing D<D1 and instructing the electronic control and motor firmware to avoid contact between said probe (69) and center conductor (68) [7].

These prior art methods are all "indirect" and, even though they do, in general allow normal operation, they are not fail-safe. Either by human error, on purpose or by software or electronic error or failure, the signal from the limit switch may be interrupted, ignored by the control software or overridden and then the motor movement, descending the probe towards the center conductor, will not stop and mechanical contact (or short circuit) will occur. The mechanical limitation means described in this invention, however, are in addition to prior "indirect" zeroing and limiting techniques and do not allow mechanical contact, neither intentionally or if the controls fail.

Probes with mechanical means for preventing contact with the center conductor of said slablines are shown in FIGS. 8 to 12.

FIG. 8 shows a permanent and non-adjustable mechanical limitation means built on to each probe. The limitation is made in form of a "T" shoulder (15) and is built-in permanently on the probe (14). The position of the T shoulder is chosen with respect with the highest level (55) of the concave surface of said probe (14), such as to allow for a distance D1 between said surface and center conductor to be larger than the distance D between T shoulder (15) and the top of said slabline (13). The dimensions are therefore chosen such that, when the probe (14) moves vertically (16) driven by axis (54), the shoulder (15) will hit the top of the slabline (13) just before the probe (14) makes contact with the center conductor (17). This will always prevent mechanical contact.

FIG. 9 shows a different, adjustable, embodiment of the invention: The probe (20) is attached to axis (22), which is driven vertically by the motor (24). A cross bar (23) is mounted on the axis (22) and a vertical screw (21) is inserted on said cross bar. Said vertical screw is adjusted (25) at a distance D from the top of the slabline (18) such as to be smaller than the distance D1 between center conductor (19) and probe (20). This way, when said probe (20) approaches the center conductor (19), the screw (21) will hit the top of the slabline (18) just before said probe (20) makes mechanical contact with the center conductor (19). Since the position of said screw (21) is adjustable (25), this mechanism allows for fine tuning of the tuner's reflection factor performance, up to its maximum value with its inherent limitations as outlined before.

FIG. 10 shows mechanical means of contact prevention using two vertical screws (30, 31) inserted into a cross bar (29), which is mounted on the tuner probe (28) itself. The vertical position of the screws is adjusted at a distance D from the top of the slabline (26), such as, when the probe is moved vertically (32) by the axis (33), the screws (30, 31) will hit the top of the slabline (26) just before the probe (28) makes contact with the center conductor (27). This embodiment ensures also balanced movement limitation and prevents possible tilting of the axis as it may be possible in the embodiment of the configuration in FIG. 9. The embodiment of FIG. 9 may also use two symmetrical screws, similar to FIG. 10. This mechanism also allows for fine tuning of the tuner's reflection factor performance, up to its maximum value with its inherent limitations as outlined before.

FIGS. 11 and 12 show tuner probe configurations with limiting means using dowel pins (rods) instead of adjustable screws. In FIG. 11 the screw (21) of FIG. 9 has been replaced by a dowel pin (38). This pin (38) is inserted in a cross bar (37) which is attached on to the vertical axis (41) driven by the motor (42). Said dowel pin (38) is secured on cross bar (37) using a set-screw (39). The vertical position (40) of said dowel pin (38) is adjusted and secured at a height such as to hit the top wall of the slabline (34) just before the probe (36) makes contact with the center conductor (35).

In FIG. 12 the screws (30, 31) of FIG. 10 are replaced by dowel pins (47) and (48). Said dowel pins are inserted in a cross bar (46) and secured by set screws (49) and (50) at such height as to hit the top wall of the slabline (43) just before said probe (45) makes contact with the center conductor (44) of said slabline.

The tuner probes described in FIGS. 8 to 12, which use one or more mechanical limits for preventing contact with the center conductor, can be used in all types of remotely controlled electro-mechanical or manually controlled slide screw tuners. Whether the vertical position of the axis is driven by motor or by hand it is useful to avoid a mechanical or galvanic contact and short circuit of the probe with the center conductor. In particular, when the axis is controlled by electrical motors, via software, and even if there is some electrical or optical limit switch intended to prevent a short circuit, such switches and their control are not fail-safe. Any bug or disruption of the software, electrical wiring or connector contact during operation, may override said electrical or optical switch and create a short circuit between the probe and the center conductor. Only a mechanical stop, permanent or permanently adjusted, as part of the probe or the axis controlling the probe, will prevent this from happening.

RF tuner probes may comprise more that a single tuning section (FIGS. 16, 17) [5]; said probes are connected to a vertical axis (70) and, in case of more than one tuning section, are supported by mechanical structures (75, 76) allowing said probes to move together horizontally and vertically; mechanical means for preventing contact between said probes (72, 73, 74, 77, 78, 79, 80) and the center conductor (71) are also applicable either individually on each probe as shown in FIGS. 8, 10, 12 or on the common axis as shown in FIGS. 9, 11.

FIG. 18 illustrates an example of implementing mechanical means of contact prevention between said RF probes and center conductor of said slablines in multi-section probes. The horizontal bars (81, 82) are mounted permanently on said multi-section probe at a distance (83), such that said bar (81, 82) hits the top of said slabline before said probe makes contact with said center conductor as shown in FIG. 7. In FIG. 19 vertical screws (84, 85, 86, 87) can easily be inserted in the cross bars (81, 82) to make the mechanical limit adjustable, as shown in FIG. 10; dowel pins instead of screws can also be used as shown in FIG. 12. The same way such mechanical limitations in form of vertical screws or dowel pins can be introduced in other multi-section probe configurations as shown in FIG. 17 (subsets FIG. 8 or FIG. 10), or on the vertical axis (FIG. 9) limiting the vertical movement of the multi-section probes shown in FIG. 17.

FIG. 20 shows another possible implementation of permanent mechanical limit (87, 88) on the prior art multi-section probe (subset FIG. 8 in FIG. 17) [5].

Permanent and adjustable mechanical obstacles of vertical probe movement can be combined, as shown in FIG. 22; in this case a cross bar (91) built into the probe (20) and a vertical screw (21) attached to the vertical axis (22) are combined to allow a fine vertical adjustment (25) with the security that the vertical travel will never damage the center conductor, even if the fine adjustment has to be made such that temporary mechanical contact between probe and center conductor is at the limit of operation, as it often happens, when very high reflection factors are required and the probe must go very close to the center conductor. In this case the distance D2 must be chosen equal of marginally smaller than D. Combinations of all adjustable and permanent mechanical obstacles of vertical movement are easily imaginable.

FIG. 23 shows a vertically adjustable (25) mechanical obstacle (92) preventing contact between the probe (20) and the center conductor (19), said obstacle being mounted on the vertical axis (22) of the tuner; said obstacle (92) has the form of a 90 degree angle and is secured by a set screw (93) against the vertical axis (22).

Alternative configurations of the above tuner probes and limiting mechanisms are imaginable, but their effect will always be to introduce a fail-safe means for preventing mechanical contact between the probe and the center conductor. Said obvious variations, however, shall not impede on the validity and general coverage of the claims of the hereby described concept of using mechanical stops for preventing the probes in slide screw tuners from touching the center conductors.

What I claim as my invention is:

1. A method for preventing mechanical or electrical contact between the metallic probes (slugs) and the center conductor of the slabline in slide screw impedance tuners, while allowing high reflection factor and power handling, employs adjustable mechanical stops attached either on the vertical tuner axis controlling the position of said probes or on the probes themselves; whereby said probes are capacitively coupled with said center conductor and can be positioned at close proximity to said center conductor.

2. A method as in claim 1, whereby said tuners comprise multi-section probes; each said probe comprising a plurality of conductive probe sections, supported mechanically by a dielectric or metallic structure which allows said probes to be moved together in a direction perpendicular and parallel to the axis of said slabline, wherein said probes comprise adjustable mechanical obstacles limiting the vertical movement.

3. Multi-section RF tuner probes as in claim 2, wherein said mechanical obstacle has the form of a cross bar attached to said probes and is adjusted and secured at such distance from the bottom of said probes as, for said obstacle to make mechanical contact with the top of the slabline in which said probes are inserted, before said probes make electrical or mechanical contact with the center conductor of said slablines.

4. Multi-section RF probes as in claim 2, wherein said mechanical obstacle has the form of a cross bar attached to the vertical axis controlling the movement of said probes, and is adjusted and secured at such distance from the bottom of said probes as, for said obstacle to make mechanical contact with the top of the slabline in which said probes are inserted, before said probes make electrical or mechanical contact with the center conductor of said slablines.

5. A method as in claim 1, whereby said impedance tuner comprises an input and an output port and a slotted airline (slabline) between said ports, one or more mobile carriages travelling parallel to the axis of said slabline, each carriage comprising one or more vertical assemblies; whereby each said assembly comprises a remotely controlled vertical axis on which is attached a metallic probe, said probe being movable perpendicularly and parallel to the axis of said slabline and having a basic form of a parallelepiped with a concave bottom surface parallel to and facing the center conductor of said slabline;

and whereby said vertical assembly comprises at least one adjustable mechanical obstacle limiting the vertical movement of said probe, when said probe is approaching the said center conductor, in order to prevent electrical or mechanical contact between said probe and center conductor.

6. A method as in claim 5, whereby said probes for said tuners comprise an adjustable mechanical obstacle limiting their vertical movement, wherein said obstacle has the form of one or more screws inserted vertically into cross bars, said cross bars being attached to or built into the body of said probes, said screws being adjusted at such distance from the bottom of said probes, as to make contact with the top of the slabline, in which said probes are inserted, before said probes make electrical or mechanical contact with the center conductor of said slabline.

7. A method as in claim 5, whereby said probes for said tuners comprise a mechanical obstacle limiting their vertical movement, wherein said obstacle has the form of one or more screws inserted vertically into a cross bar, which is attached to the vertical axis controlling the movement of said probes, said screws being adjusted at such distance from the bottom of said probes, as to make mechanical contact with the slabline in which said probes are inserted, before said probes make electrical or mechanical contact with the center conductor of said slabline.

8. A method as in claim 5, whereby said probes for said tuners comprise a mechanical obstacle limiting their vertical movement, wherein said obstacle has the form of one or more dowel pins inserted vertically into a cross bar, said cross bar being attached to or built into the body of said probes, said dowel pins being adjusted and secured at such distance from the bottom of said probes, as to make contact with the top of the slabline, in which said probes are inserted, before said probes make electrical or mechanical contact with the center conductor of said slabline.

9. A slide screw tuner as in claim 5, whereby said vertical axis is manually controlled using a precision screw.

10. A method as in claim 5, whereby said probes for said tuners comprise a mechanical obstacle limiting their vertical movement, wherein said obstacle has the form of one or more dowel pins inserted vertically into a cross bar, said cross bar being attached to or built into said vertical axis controlling the vertical movement of said probes, said dowel pins being adjusted and secured at such distance from the bottom of said probes, as to make mechanical contact with the slabline in which said probes are inserted, before said probes make electrical or mechanical contact with the center conductor of said slabline.

11. A method as in claim 5, whereby said probes for said tuners comprise fixed and adjustable mechanical obstacles of vertical probe movement, wherein said fixed obstacle has the form of a cross bar 1 attached to or built into said probes, and said adjustable obstacle has the form of dowel pins inserted vertically into a cross bar 2, attached to the vertical axis controlling the vertical movement of said probes; said cross bar 1 is placed at a distance from the bottom of said probe such as to make mechanical contact with the top of the slabline, in which said probe is inserted, when or immediately after said probe makes mechanical contact with the center conductor; and whereby said dowel pins are fine adjusted and secured on the cross bar 2 such as to make mechanical contact with the slabline before the probes make electrical or mechanical contact with the center conductor.

12. Multi-section RF probes for slide screw impedance tuners, comprising a plurality of conductive probe sections, supported mechanically by a dielectric or metallic structure, wherein said probes comprise adjustable mechanical obstacles of vertical movement as in claim 11.

13. A method as in claim 5, whereby said probes for said tuners comprise fixed and adjustable mechanical obstacles of vertical probe movement, wherein said fixed obstacle has the form of a cross bar, attached to or built into said probes, and said adjustable obstacle has the form of dowel pins inserted vertically into said cross bar; said cross bar is placed at a distance from the bottom of said probe such as to make mechanical contact with the top of the slabline, in which said probe is inserted, when or immediately after said probe makes mechanical contact with the center conductor of said slabline and said dowel pins are fine adjusted and secured such as to make contact with the slabline before the probes make electrical or mechanical contact with the center conductor.

14. Multi-section RF probes for slide screw impedance tuners, comprising a plurality of conductive probe sections, supported mechanically by a dielectric or metallic structure, wherein said probes comprise adjustable mechanical obstacles of vertical movement as in claim 13.

15. A method as in claim 5, whereby said probes for said tuners comprise fixed and adjustable mechanical obstacles of vertical probe movement, wherein said fixed obstacle has the form of a cross bar 1, attached to or built into said probes, and said adjustable obstacle comprises a cross bar 2, attached to the vertical axis and vertical screws inserted into said cross bar 2; and whereby said cross bar 1 is placed at a distance from the bottom of said probe such as to make mechanical contact with the top of the slabline, in which said probe is inserted, when or immediately after said probe makes mechanical contact with the center conductor of said slabline; and whereby said screws inserted in the cross bar 2 are fine adjusted such as to make contact with said slabline before said probes make electrical or mechanical contact with the center conductor.

16. Multi-section RF probes for slide screw impedance tuners, comprising a plurality of conductive probe sections, supported mechanically by a dielectric or metallic structure, wherein said probes comprise adjustable mechanical obstacles of vertical movement as in claim 15.

17. A method as in claim 5, whereby said probes for said tuners comprise fixed and adjustable mechanical obstacles of vertical probe movement, wherein said fixed obstacle has the form of a cross bar attached to or built into said probes, and said adjustable obstacle has the form of screws inserted vertically into said cross bar; said cross bar is placed at a distance from the bottom of said probe such as to make mechanical contact with the top of the slabline, in which said probe is inserted, when or immediately after said probes make mechanical contact with the center conductor of said slabline; and whereby said screws are fine adjusted such as to protrude from the cross bar and make contact with the slabline just before said probes make electrical or mechanical contact with the center conductor.

18. Multi-section RF probes for slide screw impedance tuners, comprising a plurality of conductive probe sections, supported mechanically by a dielectric or metallic structure, wherein said probes comprise adjustable mechanical obstacles of vertical movement as in claim 17.

19. A method as in claim 5, wherein said tuner probes comprise at least one adjustable mechanical obstacle limiting their vertical movement towards said center conductor, said obstacle being attached to or built into said probes and placed at such distance from the bottom of said probes, for said mechanical obstacle to make contact with the top of the slabline, in which said probes are inserted, before said probes make electrical or mechanical contact with the center conductor of said slabline.

20. Probes for slide screw impedance tuners as in claim 19, wherein said adjustable mechanical obstacle has the form of a cross bar, attached to or built into said probes.

21. A method as in claim 5, whereby said vertical assembly comprises an adjustable mechanical obstacle limiting the vertical movement of said probes, wherein said mechanical obstacle is attached to or built into the vertical axis controlling the movement of said probes and placed at such distance from the bottom of said probes as for said obstacle to make contact with the top of the slabline in which said probes are inserted, before said probes make electrical or mechanical contact with the center conductor of said slablines.

22. Vertical assemblies for slide screw impedance tuners, as in claim 21, comprising an adjustable mechanical obstacle limiting their vertical movement, wherein said obstacle has the form of an inverse "L" cross bar attached to or built into said vertical axis controlling the vertical movement of said probes, said cross bar being placed at such distance from the bottom of said probes, as to make mechanical contact with the slabline in which said probes are inserted, before said probes make electrical or mechanical contact with the center conductor of said slabline.

23. Multi-section RF probes for slide screw impedance tuners, comprising a plurality of conductive probe sections, supported mechanically by a dielectric or metallic structure, wherein said probes comprise an adjustable mechanical obstacle of vertical movement as in claim 6, 7, 8 or 10.

\* \* \* \* \*